(12) United States Patent
Apfel et al.

(10) Patent No.: US 7,970,125 B2
(45) Date of Patent: *Jun. 28, 2011

(54) OUTPUT STACKING ARCHITECTURE FOR AN AMPLIFIER

(75) Inventors: Russell J. Apfel, Austin, TX (US); Richard B. Webb, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1413 days.

This patent is subject to a terminal disclaimer.

(21) Appl. No.: 11/453,418

(22) Filed: Jun. 15, 2006

(65) Prior Publication Data
US 2007/0291930 A1 Dec. 20, 2007

(51) Int. Cl.
*H04M 1/00* (2006.01)
*H04M 9/00* (2006.01)

(52) U.S. Cl. ......................................... 379/413

(58) Field of Classification Search .................. 379/413
See application file for complete search history.

(56) References Cited

U.S. PATENT DOCUMENTS

| | | | |
|---|---|---|---|
| 4,197,435 A | 4/1980 | Jackson et al. | |
| 4,323,734 A | 4/1982 | Kimzey | |
| 4,600,811 A | 7/1986 | Hayashi et al. | |
| 5,596,637 A | 1/1997 | Pasetti et al. | |
| 5,619,567 A | 4/1997 | Apfel | 379/413 |
| 5,737,411 A | 4/1998 | Apfel | 379/413 |
| 5,854,839 A | 12/1998 | Chen et al. | |
| 5,881,129 A | 3/1999 | Chen et al. | |
| 6,320,467 B1 | 11/2001 | Hallen | |
| 6,351,528 B1 | 2/2002 | Apfel | 379/377 |
| 6,356,624 B1 | 3/2002 | Apfel | 379/27.01 |
| 6,476,753 B1 | 11/2002 | Hansen et al. | |
| 6,566,957 B1 | 5/2003 | Caine | |
| 6,735,302 B1 | 5/2004 | Caine et al. | |
| 6,778,663 B1 | 8/2004 | Schopfer | |
| 6,934,384 B1 | 8/2005 | Hein et al. | 379/399.02 |
| 6,956,945 B2 | 10/2005 | Apfel | 379/413 |
| 7,113,590 B2 | 9/2006 | Apfel | 379/399.01 |
| 7,116,778 B2 | 10/2006 | Eckhoff et al. | 379/399.01 |
| 7,477,095 B2 * | 1/2009 | Apfel | 327/542 |
| 2003/0072436 A1 | 4/2003 | Eckhoff et al. | 379/399.01 |
| 2004/0258183 A1 | 12/2004 | Popescu et al. | |
| 2005/0024143 A1* | 2/2005 | Humphrey | 330/255 |
| 2006/0115076 A1 | 6/2006 | Enriquez et al. | |

OTHER PUBLICATIONS

U.S. Patent and Trademark Office, Office Action dated Nov. 12, 2009 with Reply filed on Nov. 12, 2010 in U.S. Appl. No. 11/453,417.
U.S. Patent and Trademark Office, Office Action dated May 26, 2010, in U.S. Appl. No. 11/453,417.

(Continued)

*Primary Examiner* — Alexander Jamal
(74) *Attorney, Agent, or Firm* — Trop, Pruner & Hu, P.C.

(57) ABSTRACT

In one embodiment, the present invention includes an operational amplifier having a first input to receive a first current formed of an input current and an offset current. A first MOSFET device having a gate terminal may be coupled to an output of the operational amplifier. An output stack including one or more cascoded devices to provide an output current corresponding to a gain of the operational amplifier may be coupled to a first terminal of the first MOSFET device. The operational amplifier may be used in various circuitry, such as a subscriber line interface circuit (SLIC).

13 Claims, 13 Drawing Sheets

OTHER PUBLICATIONS

U.S. Patent and Trademark Office, Office Action mailed Sep. 28, 2010 with Reply filed on Dec. 23, 2010 in U.S. Appl. No. 11/646,057.

U.S. Appl. No. 11/646,057, filed Dec. 27, 2006, entitled, "Methods And Apparatus For Low Voltage Control Of A Subscriber Line Interface Circuit," by Russell J. Apfel.

U.S. Appl. No. 11/645,878, filed Dec. 27, 2006, entitled, "A Tracking Voltage Regulator For A Subscriber Line Interface Circuit," by Russell J. Apfel.

Silicon Laboratories, "Si3220/25 Dual ProSLIC," Oct. 2001, pp. 1-2.

Silicon Laboratories, "Si324x/Si3205 Quad ProSLIC Programmable CMOS SLIC/Codec," Sep. 22, 2005, pp. 1-2.

U.S. Appl. No. 11/453,417, filed Jun. 15, 2006, entitled, "Methods And Apparatus For Performing Subscriber Line Interface Functions," by Russell J. Apfel.

U.S. Appl. No. 11/453,702, filed Jun. 15, 2006, entitled, "Current Mirror Architectures," by Russell J. Apfel.

* cited by examiner

OUTPUT STACKING ARCHITECTURE FOR AN AMPLIFIER

FIELD OF THE INVENTION

The present invention relates to telecommunications, and more particularly to subscriber line interface circuitry for telecommunication systems.

BACKGROUND

Subscriber line interface circuits (SLICs) are often present in a central office exchange of a telecommunications network or remote locations thereto for use in providing a communication interface between a digital switching network of a central office and an analog subscriber line. The analog subscriber line connects to a subscriber station or telephone instrument at a location that is remote from the central office exchange.

The analog subscriber line and subscriber equipment (e.g., a telephone) form a subscriber loop. The interface requirements of a SLIC typically require high voltages and currents for control signaling with respect to the subscriber equipment on the subscriber loop. Voiceband communications are typically low voltage analog signals on the subscriber loop. Accordingly, the SLIC performs various functions with respect to voiceband and control signaling between the subscriber equipment and the central exchange.

SLIC functionality has generally been implemented in multiple integrated circuits (ICs), or combinations of ICs and discrete elements. Typically, significant high voltage circuitry is included in one IC to provide various high voltage functionality of a SLIC. Accompanying low voltage IC's are used to perform control functions for the high voltage portion and also to perform low voltage tasks, voice signal processing, and to provide an interface to system circuitry, e.g., a system on a chip (SOC) such as a digital signal processor (DSP) or other digital processing circuit of a central office or similar location. In turn, the DSP is coupled to provide system input/output (I/O) signals to other locations in the telecommunications network. In other implementations, instead of a DSP interface, the SLIC may couple directly into a switching system.

Typically, a significant number of wires or signal lines are used to connect low voltage portions of a SLIC with the high voltage portion. Furthermore, different SOCs or DSPs used in a system can require different information from a SLIC. That is, different DSPs have different capabilities with respect to signal processing. Some DSPs include capabilities for analog signal processing such as codec functionality and filtering, while other DSPs strictly handle digital signal processing for system requirements such as code compression, call processing, echo cancellation, among others. Accordingly, different SLIC configurations are needed to interface with different DSPs.

These different SLIC configurations typically require completely different designs, often in different process technologies. Such different designs are not readily reused across different process technologies and different SLIC configurations.

Another limitation with respect to SLIC design is that because of the criticalities of the different low voltage and high voltage components, it is typically difficult to port a given design across different process technologies. Thus, a SLIC design implemented in one process technology is not easily ported to another technology, owing to differences in device characteristics. This typically requires the need for significant calibration, trimming and other design-intensive matching of devices.

The high voltage portion of a SLIC typically includes bidirectional amplifiers (either current or voltage mode). These traditional amplifiers are high-voltage operational amplifiers that provide for precise bidirectional current or voltage gain applications. These bidirectional amplifiers require large output transistors to source and sink the output current, and at relatively high currents these output transistors consume significant real estate. Furthermore, the amplifier must operate over a full power supply range (i.e., positive and negative supplies), requiring many high voltage transistors and careful design.

A need thus exists for improved manners of implementing subscriber line interface circuitry.

SUMMARY OF THE INVENTION

According to one aspect, the present invention includes an operational amplifier having a first input coupled to receive a first current formed of an input current and an offset current. A first MOSFET device having a gate terminal may be coupled to an output of the operational amplifier. The first MOSFET device may further have a second terminal coupled to a second input of the operational amplifier. An output stack including one or more cascoded devices to provide an output current corresponding to a gain of the operational amplifier may be coupled to a first terminal of the first MOSFET device. Various circuitry may be coupled to the operational amplifier, including resistors, input stages and the like. In some implementations, the operational amplifier may include bipolar input devices.

The operational amplifier may be a unidirectional current amplifier coupled to a single power supply, and an apparatus in accordance with one embodiment may include a second operational amplifier of an opposite polarity to the first operational amplifier coupled to a power supply of a different polarity. An input stage may include an input level shifter to receive and split a bidirectional input current into first and second unidirectional currents coupled to the different operational amplifiers.

Yet another aspect of the present invention is directed to an operational amplifier having a first input coupled to receive an input current, and a first current source to generate an offset current to be provided to the first input, where the offset current prevents saturation of the operational amplifier when the input current is close to zero. The operational amplifier may be coupled to an output MOSFET that in turn is coupled to an output stack having at least one cascoded device to provide an output current corresponding to a gain of the operational amplifier. A control structure may control the cascoded device(s) to provide an output voltage that exceeds a breakdown voltage of the device(s). In some implementations, the cascoded devices may be double-diffusion metal-oxide semiconductor (DMOS) devices.

A still further aspect of the present invention is directed to a system that includes a unidirectional current amplifier having a first input coupled to receive an input current of a first polarity only, an output device having a gate terminal coupled to an output of the unidirectional current amplifier and a second terminal coupled to a second input of the unidirectional current amplifier, and an output stack coupled to a first terminal of the output device. The output stack may include at least two cascoded devices to provide an output current corresponding to a gain of the unidirectional current amplifier.

DETAILED DESCRIPTION

In various embodiments, traditional functionality performed by SLIC circuitry may be implemented in various components in an effort to reduce component counts and reduce costs of manufacture. More specifically, various so-called BORSCHT functions, and more particularly low voltage BORSCHT functions may be provided in low voltage ICs, such as a DSP or other low voltage device. In different implementations, different amounts of SLIC functionality may be moved into such low voltage devices. These low voltage devices may include, in addition to DSPs, ICs for signal processing for voice over internet protocol (VoIP) or digital subscriber line (DSL) implementations. Example system implementations will be described below. Note that with respect to the system implementations shown, varying amounts of SLIC functionality can be off-loaded from a high voltage device to one or more low voltage devices.

Figure 1A:
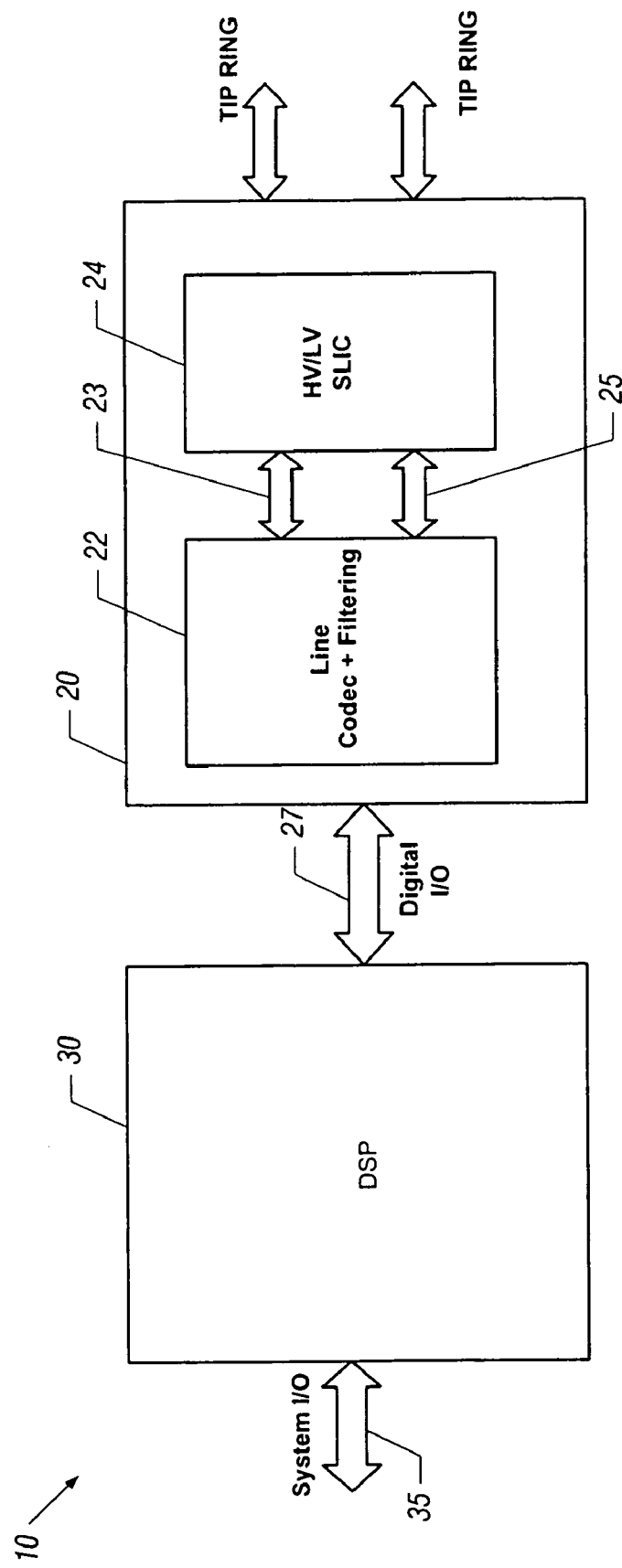
FIG. 1A is a block diagram of a system implementation in accordance with one embodiment of the present invention.

Referring now to FIG. 1A, shown is a block diagram of a system implementation in accordance with one embodiment of the present invention. As shown in FIG. 1A, system 10 may include a line card 20 that includes, for example, separate ICs including a line codec 22 and a SLIC 24 which may include both high voltage and low voltage SLIC functionality. Codec 22 may further perform filtering functions. These ICs may be coupled via a first interface 23 and a second interface 25, in which first interface 23 includes control signals while second interface 25 includes data signals. Line card 20 may be coupled to a subscriber line, e.g., via tip and ring lines. In the embodiment shown in FIG. 1A, multiple channels may be present in line card 20 such that line card 20 may interface with a first subscriber line via a first interface and a second subscriber line via a second interface.

In turn, line card 20 may be coupled via a digital I/O 27 to a DSP 30. DSP 30 may be a conventional DSP that performs only digital signal processing. Accordingly, all coding and decoding functions may be performed in line codec 22 and thus only digital signaling occurs over digital I/O 27. DSP 30 may be coupled to other system components via a system I/O 35. While described with this particular implementation with regard to FIG. 1A, it is to be understood that the scope of the present invention is not so limited, and in other embodiments different manners of segmenting SLIC functionality between different devices of a system can be implemented. For example, in different implementations instead of an interface to DSP 30, a line card may interface directly with switching circuitry of a central office, e.g., via a backplane or other such connection. For example, in other implementations, more SLIC functionality may be moved to the codec-based IC.

Figure 1B:
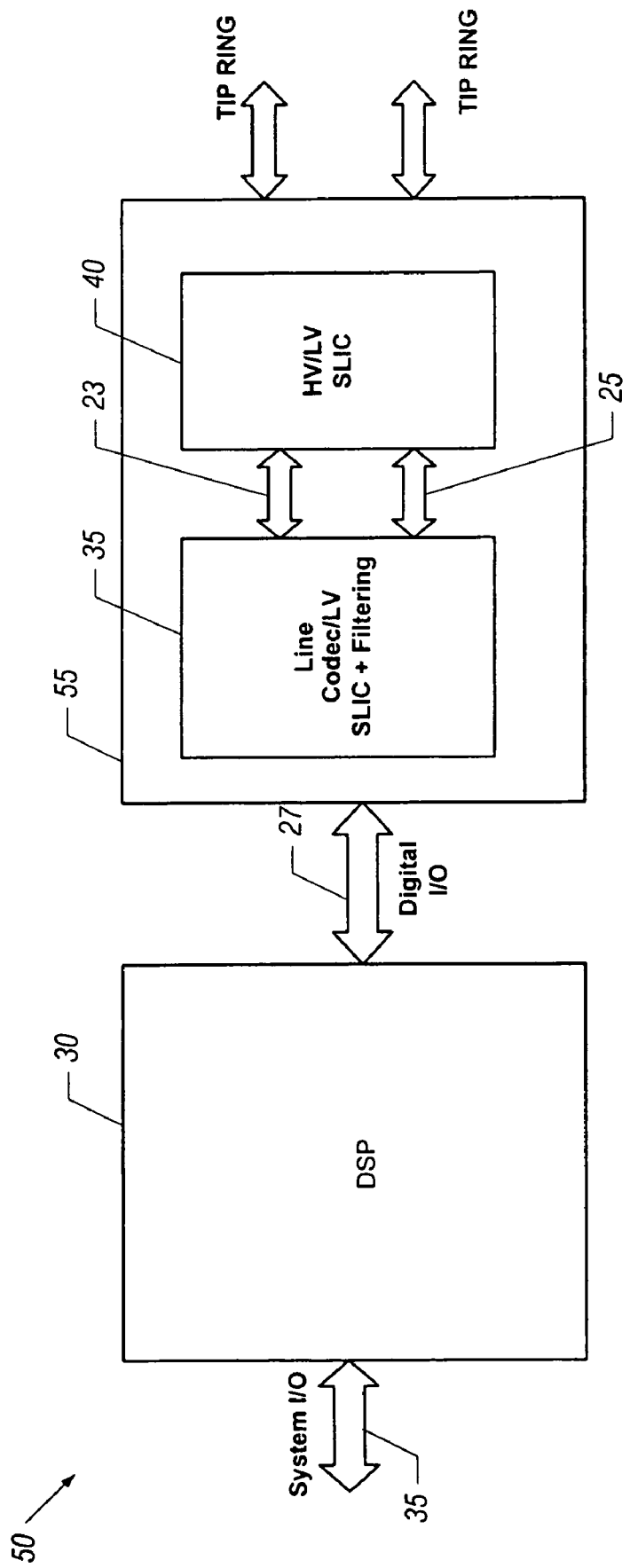
FIG. 1B is a block diagram of a system implementation in accordance with another embodiment of the present invention.

Thus referring now to FIG. 1B, shown is a block diagram of another system implementation in accordance with an embodiment of the present invention. As shown in FIG. 1B, system 50 may include a line card 55 that includes separate ICs, namely a codec/low voltage SLIC 35 and a high voltage/low voltage SLIC 40. In this system implementation, at least portions of the low voltage SLIC functionality is provided in IC 35, which further performs coding/decoding functions in addition to filtering. SLIC 40 includes the high voltage SLIC functionality, as well as at least a portion of low voltage SLIC functions. In this embodiment, reduced costs may be realized by moving at least some of these low voltages SLIC functions into IC 35, which is a low voltage IC. In other respects, system 50 may be adapted similarly as system 10 of FIG. 1A.

Figure 2:
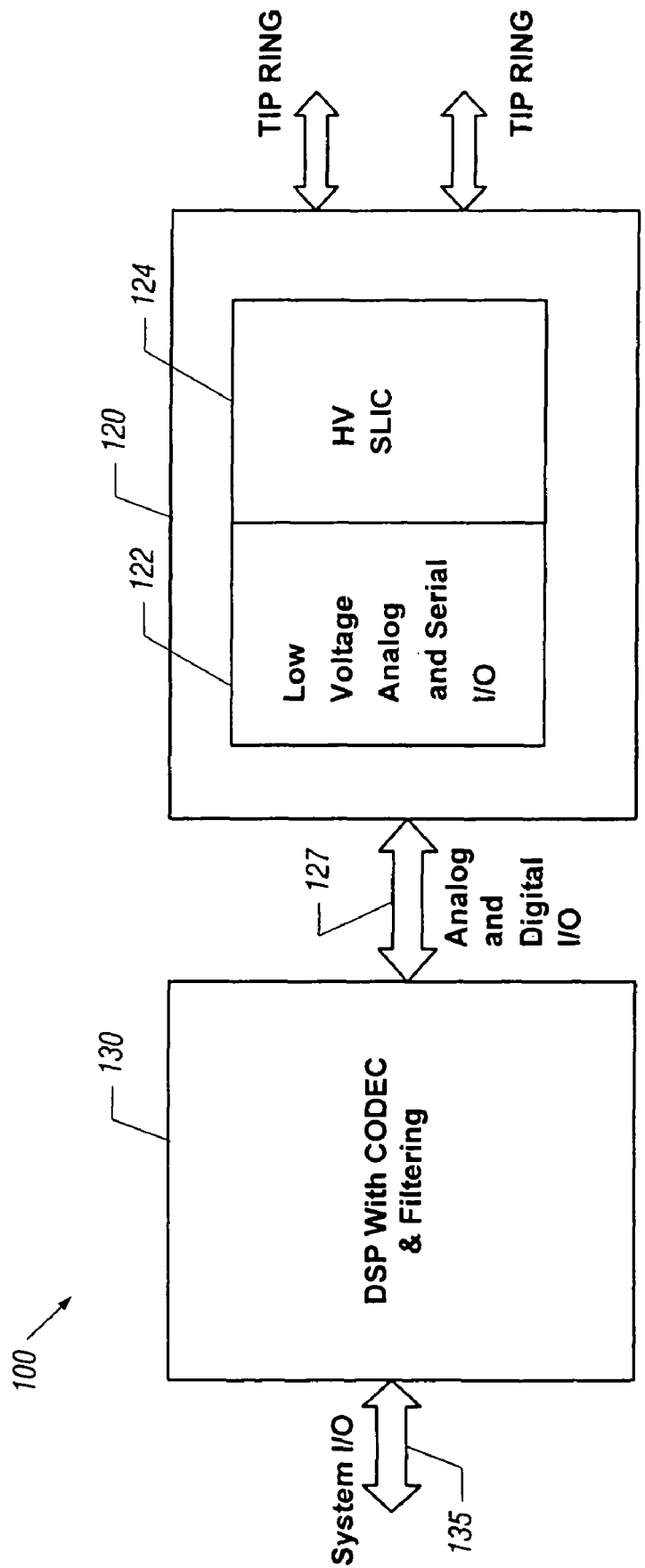
FIG. 2 is a block diagram of a system implementation in accordance with another embodiment of the present invention.

Referring now to FIG. 2, shown is a block diagram of a system implementation in accordance with another embodiment of the present invention. As shown in FIG. 2, system 100 includes a line card 120 that is coupled to a DSP 130. In this embodiment, DSP 130 includes codec functionality to receive analog signals and perform various coding operations on analog data (e.g., voiceband communications), as well as filtering. Thus in this embodiment, various functionality previously present in a line card can be performed in a DSP or other components to which a line card is coupled. For example in the embodiment shown in FIG. 2, codec and filter functionality may be incorporated into such a DSP or other component. Accordingly, a combined analog and digital I/O interface 127 couples line card 120 and DSP 130. Because of the different type of DSP used (as compared with FIG. 1), line card 120 may include different components than line card 20 of FIG. 1. Namely, line card 120 may include a high voltage SLIC 124 and a low voltage IC 122. Low voltage IC 122 may include control circuitry to implement low voltage analog and I/O interface functions. As further shown in FIG. 2, line card 120 is coupled to, e.g., two subscriber loops via first and second interfaces. In turn, DSP 130 is coupled to a remainder of a system via a system I/O interface 135. Accordingly, based on various system configurations and more particularly different DSPs with which a line card is coupled, different ICs or other circuitry to implement different functionality may be incorporated within a given line card.

Still further, in other embodiments a minimal amount of circuitry may be implemented within a line card or high voltage SLIC. To this end, various low voltage control and SLIC functionality that can be performed at a low voltage may be integrated within a system on a chip (SOC) or other such DSP. Accordingly, high voltage and other components of a line card may be reduced to a minimal portion, and coding functionality (among other such traditional SLIC functionality) may be implemented within a SOC.

Figure 3:
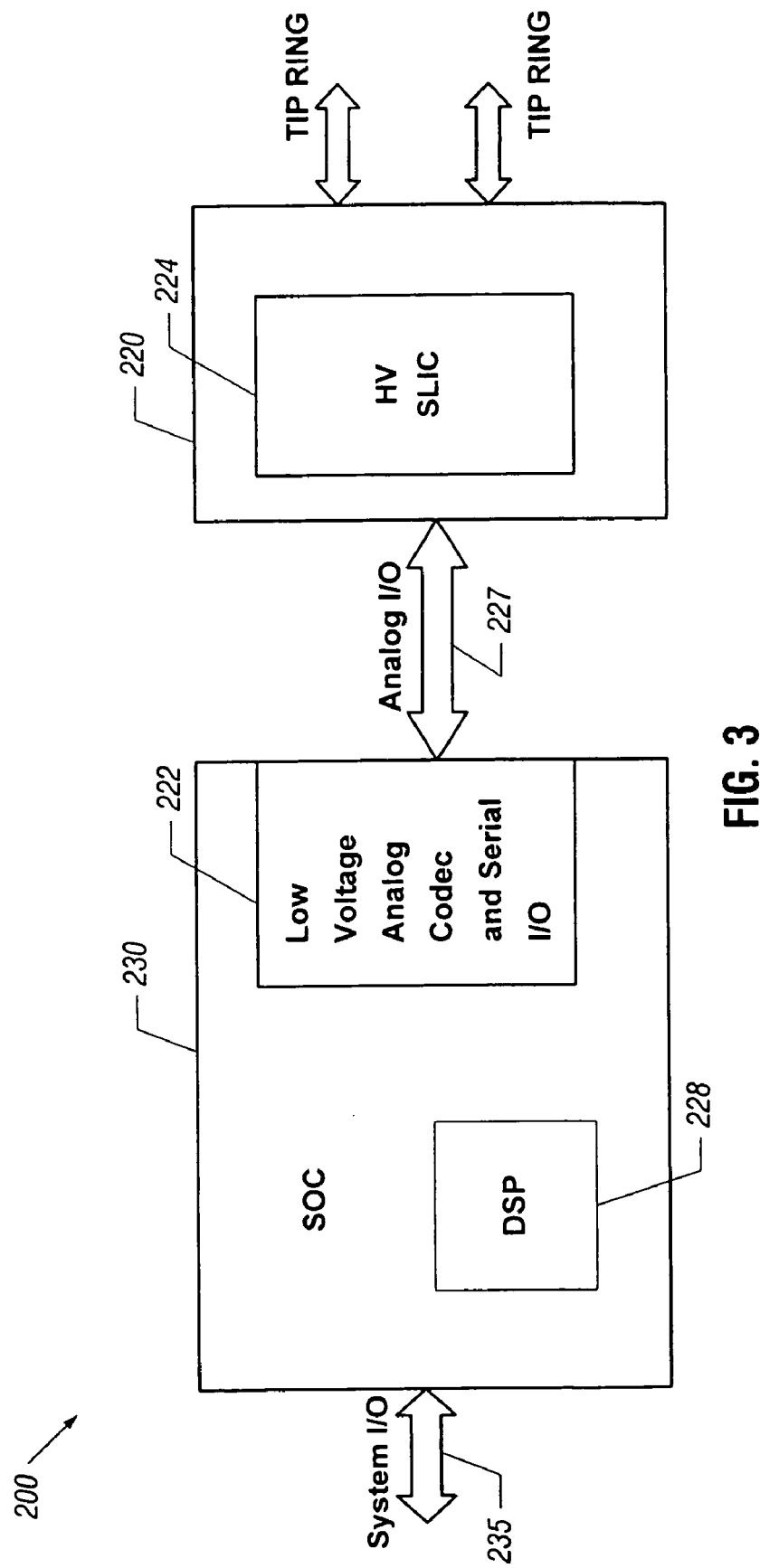
FIG. 3 is a block diagram of a system implementation in accordance with yet another embodiment.

Referring now to FIG. 3, shown is a block diagram of a portion of a system implementation in accordance with such an embodiment. As shown in FIG. 3, system 200 includes a line card 220 that includes a high-voltage SLIC 224. Note that only a single IC is present within line card 220, thus reducing size and cost of the line card. Line card 220 acts as an interface to one or more subscriber loops, e.g., via tip and ring lines. In turn, line card 220 is coupled to a SOC 230 via an analog I/O 227. In various implementations, analog I/O interface 227 may include a minimal number of wires to handle a minimum amount of signaling needed between line card 220 and SOC 230. In one embodiment, a three-pin analog I/O interface may be implemented. These three analog pins, as will be discussed further below, may flow current of different values to represent different logic values to control operation of high voltage SLIC 224. In this way, the needed information to be passed between the high voltage and low voltage portions may be implemented using minimal connections. Further, because of the use of analog signals to represent different logic states, such an interface may be easily ported across process technologies.

Still referring to FIG. 3, SOC 230 includes a low voltage core 222 that handles interface functionality with high voltage SLIC 224, along with various low voltage SLIC functionality and codec functionality. In various implementations, core 222 may be implemented with a design that is easily ported across process technologies. For example, core 222 may be built using a number of operational amplifiers (op-amps) that are easily ported across process technologies without the need for precision matching or other trimming or calibration functions. Furthermore, in various embodiment, core 222 may be a multi-channel core that can perform signal processing for multiple communication channels. Core 222 thus may be a generic core to handle low voltage SLIC functionality. As such, core 222 may be implemented in a design of a variety of DSPs or SOCs that are implemented in many different process technologies. For example, different SOCs may be implemented using different CMOS process technologies of different technology nodes. Or other process implementations such as bipolar, BiCMOS, DMDMOS, or other process technology may be used. In addition to core 222, SOC 230 further includes conventional DSP circuitry 228 to perform various signal processing functions. Accordingly, SOC 230 communicates with a remaining portion of a system via a system I/O interface 235.

Note that because the circuitry to implement core 222 may be based on an easily portable design, it may be possible to provide core 222 as an independent design capable of being implemented within different DSPs or SOCs of many different manufacturers. Accordingly, core 222, which may be designed by one entity, may be an independently licensable circuit design that can be readily accommodated to different process technologies of underlying SOC's of many different entities.

Figure 4:
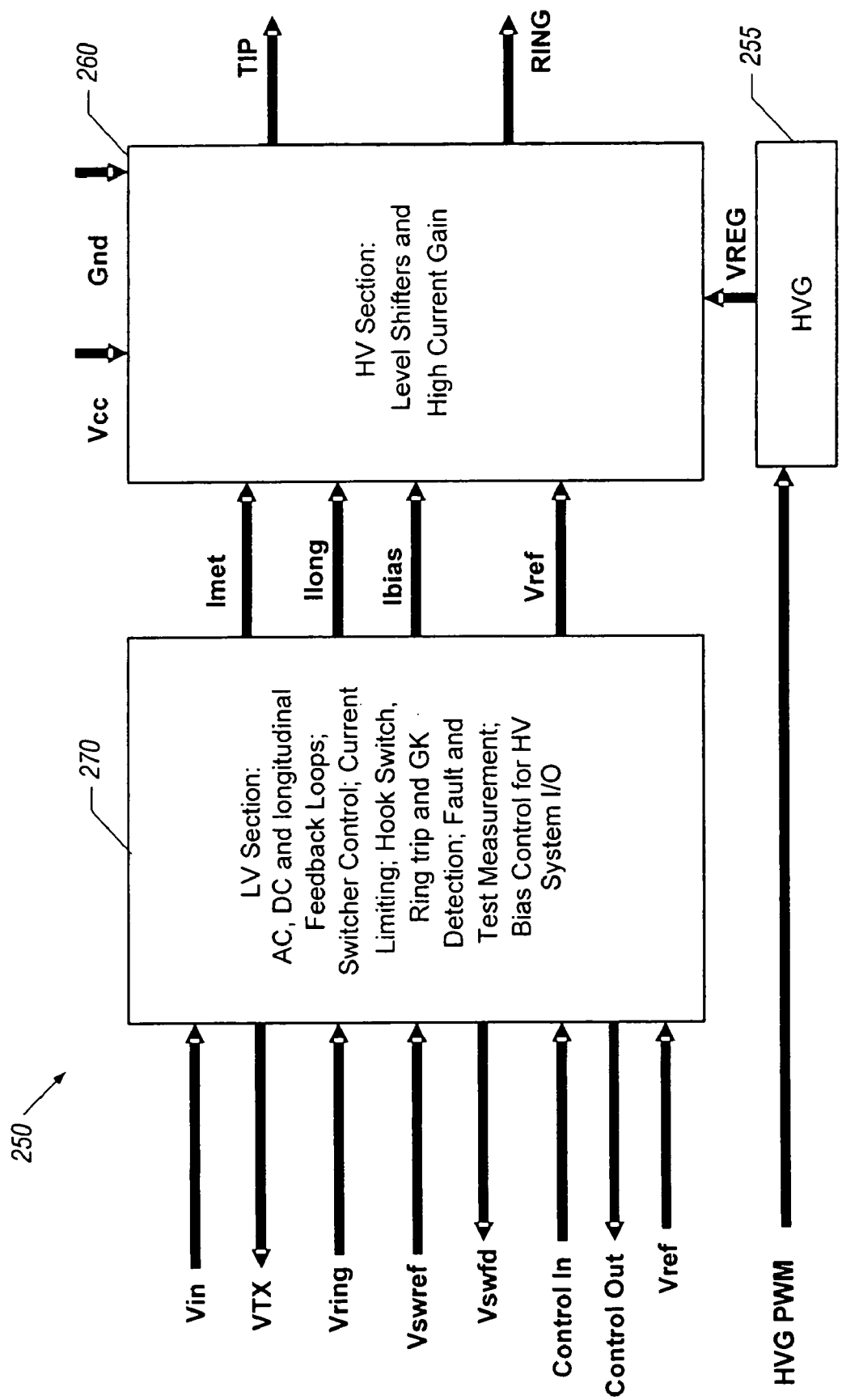
FIG. 4 is an example segmentation of functionality performed in high voltage and low voltage portions of a SLIC in accordance with an embodiment of the present invention.

In many implementations, a SLIC in accordance with an embodiment of the present invention may be designed such that as much control and functionality as possible is implemented in low voltage circuitry, thus reducing real estate and power consumption. Accordingly, only a minimal amount of circuitry is handled at high voltages. Referring now to FIG. 4, shown is an example segmentation of functionality performed in high voltage and low voltage portions of a SLIC 250 in accordance with an embodiment of the present invention. As shown in FIG. 4, SLIC 250 includes a low voltage portion 270 and a high voltage portion 260. Furthermore, a high voltage generator 255 is present and is coupled to provide a regulated voltage ($V_{REG}$) to high voltage portion 260. While shown as a separate component in the embodiment of FIG. 4, it is to be understood that high voltage generator 255 may be part of high voltage portion 260, or its functions may be split among low voltage portion 270 and high voltage portion 260. High voltage portion 260 is coupled to receive three analog signals, namely three analog currents from low voltage section 270. As shown in FIG. 4, these three signals include a metallic current ($I_{met}$), a longitudinal current ($I_{long}$) and a bias current ($I_{Bias}$), each of which will be discussed further below. Furthermore, a reference voltage may be provided from low voltage portion 270 to high voltage portion 260. High voltage portion 260 is further coupled to receive a supply voltage (i.e., $V_{cc}$) and a ground potential (i.e., GND).

Still referring to FIG. 4, low voltage portion 270 includes various circuitry to perform different functions, including AC/DC and longitudinal feedback control. Low voltage portion 270 may further include switching control, current limiting, hook switch, ring trip and GK detection. Thus low voltage portion 270 includes feedback control loops to sense conditions at the SLIC outputs and provide control signals to high voltage portion 260. Furthermore, LV portion 270 includes fault and test measurement capabilities, along with bias control for high voltage portion 260, as well as an interface to a system I/O. To implement these functions, low voltage portion 270 may include various signal lines to interface with different portions of other system circuitry, e.g., a DSP. Accordingly, as shown in FIG. 4, different voltages and control signals may be provided to and from low voltage portion 270. While shown with this particular implementation in the embodiment of FIG. 4, it is to be understood that the scope of the present invention is not so limited. Low voltage portion 270 may be located in various physical locations in different embodiments. For example, in a system such as that shown in FIG. 2, low voltage portion 270 may be physically implemented as low voltage IC 122. In a system such as that shown in FIG. 3, low voltage portion 270 may be implemented within core 222 that is itself implemented within a SOC 230.

In turn, high voltage section 260 may interface with a subscriber loop, e.g., via tip and ring lines. High voltage section 260 may further include various circuitries to perform level shifting functions as well as to amplify the currents received from low voltage portion 270. For example, in one implementation one or more high current gain blocks may be implemented within high voltage portion 260. In one embodiment, the gain blocks may have a gain of approximately 200, although the scope of the present invention is not so limited.

Figure 5:
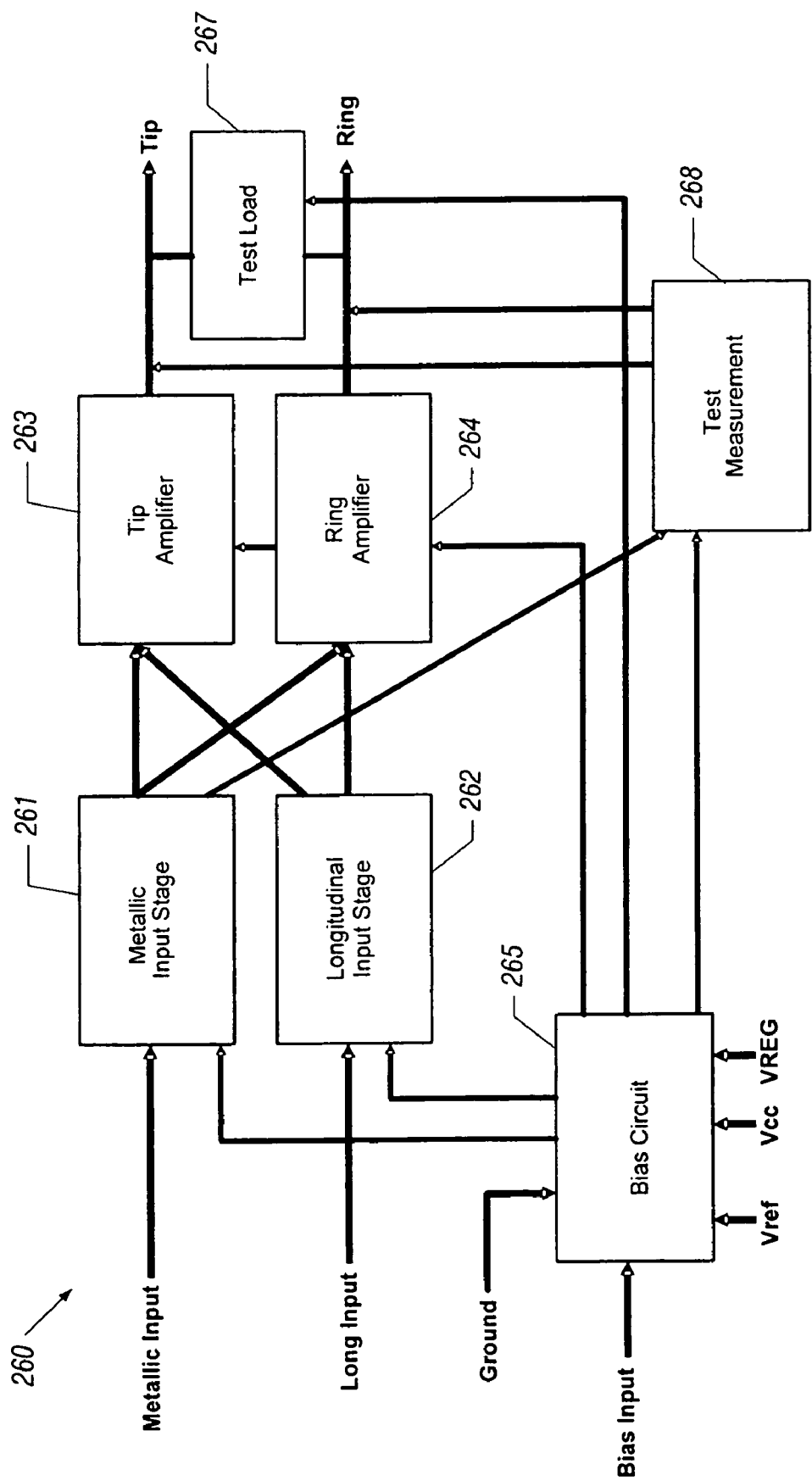
FIG. 5 is a block diagram of a high voltage portion of a SLIC in accordance with one embodiment of the present invention.

Referring now to FIG. 5, shown is a block diagram of a high voltage portion of a SLIC in accordance with one embodiment of the present invention. As shown in FIG. 5, high voltage portion 260 may include first and second input stages. The first input stage may be referred to as a metallic input stage 261 that is coupled to receive a metallic input and a bias voltage from a bias circuit 265. In turn, each of these input stages is coupled to both of a pair of current amplifiers, namely a tip amplifier 263 and a ring amplifier 264. In various embodiments, these amplifiers each may include a pair of unidirectional current gain amplifiers. These current gain amplifiers may be implemented using a low voltage operational amplifier (op-amp) building block. In some embodiments a high current gain may be effected. For example, a gain of 200 may be implemented in some embodiments.

Metallic input stage 261 generates currents that develop differential outputs in the current gain amplifiers, in other words, currents that are equal in magnitude but different in direction of flow. The second input stage may be referred to as a longitudinal input stage 262 that is coupled to receive a longitudinal input along with a bias voltage from bias circuit 265. Second input stage 262 generates currents that are equal in magnitude but in the same direction in the current amplifiers. The longitudinal current loop thus forces output currents of the current amplifiers to be equal (minus any external, common mode currents) and prevents the current amplifiers from saturation. Bias circuit 265 provides programmable biasing in order to minimize power dissipation under different conditions as well as providing an analog logic control.

The outputs of amplifiers 263 and 264 may be coupled to a subscriber loop via the tip and ring lines. As further shown in FIG. 5, high voltage portion 260 may further include a test load 267 coupled between the tip and ring lines to provide a load during testing operations. Furthermore, a test measurement circuit 268 may be coupled to measure values on the tip and ring lines. Test measurement circuit 268 may further switch in test load 267 to allow extra accuracy when attempting to measure high resistance line modes. For example, test load 267, which may be between approximately 1 kΩ and 2 kΩs, in some embodiments, may be controlled to be connected between the output lines of amplifiers 263 and 264 to provide system level test features. Note that in various embodiments, test measurement circuit 268 and test load 267 may work independently of each other, or may operate together.

Figure 6:
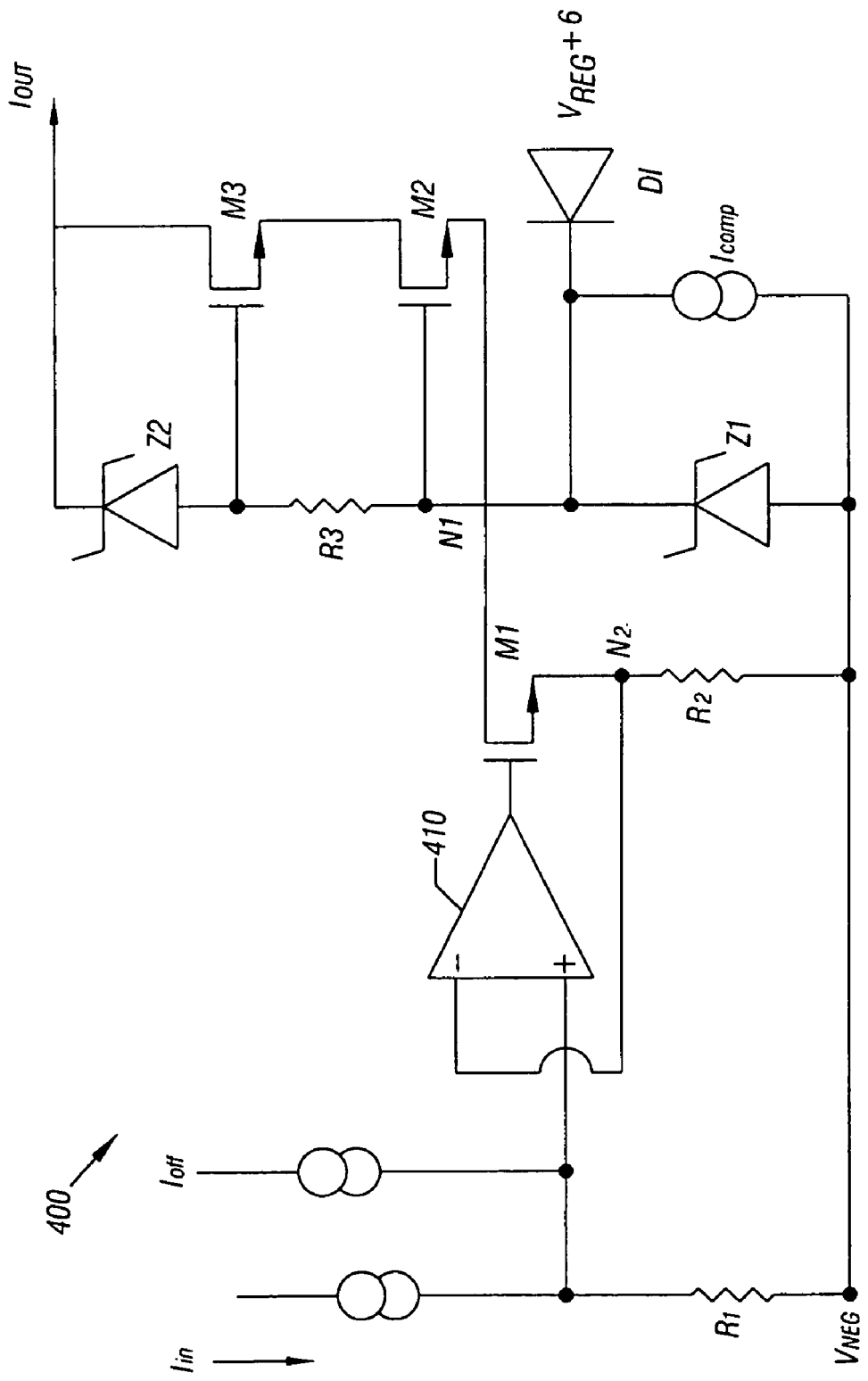
FIG. 6 is a schematic diagram of a unidirectional current gain amplifier circuit in accordance with one embodiment of the present invention.

Referring now to FIG. 6, shown is a schematic diagram of a unidirectional current gain current amplifier in accordance with one embodiment of the present invention. As shown in FIG. 6, amplifier circuit 400 may be a unidirectional amplifier that is used to form a current gain stage. More specifically, two such circuits may be combined to form a bidirectional current gain amplifier, such as tip amplifier 263 or ring amplifier 264 shown in FIG. 5.

As shown in FIG. 6, an op-amp 410, which may be a low-voltage op-amp, is coupled to receive an input current at a positive input terminal. In various implementations, the low voltage op-amp may operate between approximately 5V and 20V, depending on process technology, although the scope of the present invention is not limited in this respect. Specifically, the input current may be formed of a combination of an input current ($I_{in}$) and an offset current ($I_{off}$) which may be generated by a current source and which may provide an offset current as will be described further below. The input current $I_{in}$ may be received, e.g., from an input stage or another such source. The input current $I_{in}$ is coupled to a first terminal of a resistor R1, the second terminal of which is coupled to, for example, a negative power supply ($V_{neg}$). Accordingly, amplifier circuit 400 may be closely coupled to a single power supply, i.e., a negative power supply, rather than across multiple power supplies, e.g., positive and negative supplies.

Op-amp 410 may receive this combined input current (i.e., $I_{in}$ and $I_{off}$) and generate an amplified current according to a ratio between the first resistor R1 and a second resistor R2 on an output side of op-amp 410. As shown in FIG. 6, resistor R2 includes a first terminal coupled to a first output transistor M1 and the negative power supply. More specifically, resistor R2 may have its first terminal coupled to a source terminal of first output transistor M1, which may be a MOSFET, and more particularly an n-channel MOSFET having a gate terminal coupled to an output of op-amp 410 and a drain terminal coupled to an output transistor stack, discussed further below. The negative input terminal of op-amp 410 may receive feedback from a node N2 coupled to the source terminal of MOSFET M1.

Assuming an ideal op-amp, the input current develops a voltage across R1 equal to $R1(I_{in}+I_{off})$ and op-amp 410 forces this same voltage across R2, resulting in an output current equal to $(R1/R2)(I_{in}+I_{off})$, or a gain N of R1/R2. Assuming that MOSFET M1 has a gate current of zero, the output current at the source terminal of MOSFET M1 may track the input current, with a gain of R1/R2. In this way, op-amp 410 can drive MOSFET M1 into a very low on-resistance region to reduce overhead voltage. In various implementations, because the maximum gate voltage of MOSFET M1 may range from approximately 5 to 20 volts, op-amp 410 may formed of a low voltage design, reducing real estate.

However, using such an op-amp, a DC offset and noise may occur. DC output offset current due to the op-amp may be equal to $V_{OS}/R2$, where $V_{OS}$ is the input offset voltage of the op-amp. Such an offset voltage may be typically less than approximately 1 millivolt (mV) for a bipolar transistor input op-amp and less than approximately 10 mV for a MOS-based transistor input op-amp. The output noise current of the op-amp may be equal to $V_{in\ noise}/R2$ where $V_{in\ noise}$ is the input-referred noise of the op-amp. Bipolar transistor input op-amps are typically of lower noise than a similar MOSFET input op-amp. Accordingly, op-amp 410 may be implemented using bipolar input devices to lower DC offset and noise. Furthermore, the offset current $I_{off}$ added to the input current ensures that when the input current is zero, the output of op-amp 410 does not saturate to its lowest voltage. The offset current further provides a minimum current for output transistor M1 to keep it stable under all conditions. In this way, better amplifier overload recovery response time is effected.

It is desirable that an output voltage of circuit 400 be at a high voltage. In order to support use of lower voltage devices, the output voltage may be provided using individual devices having breakdown voltages lower than the high voltage output. To enable such a configuration, a complementary common-source output stack may be provided in which the stack is operated to provide an output voltage that exceeds the breakdown voltage of the individual devices of the stack. Thus the output voltage is split between the devices of the stack.

Still referring to FIG. 6, the drain terminal of MOSFET M1 is coupled to a cascoded stack of a plurality of output devices. Specifically, a second device M2 and a third device M3 are cascoded to increase the output voltage capability. In some embodiments, these cascoded devices may be double-diffused MOS (DMOS) devices, although other configurations are possible. Devices M2 and M3 are referenced herein as MOSFETs although they may be DMOS devices in some embodiments. As shown in FIG. 6, a source terminal of MOSFET M2 is coupled to the drain terminal of MOSFET M1 and a drain terminal of MOSFET M2 is coupled to a source terminal of MOSFET M3, which in turn has a drain terminal that provides the output current, $I_{out}$. While shown with a cascoded stack of two output devices, namely MOSFETS M2 and M3, additional such devices may be present in other embodiments.

For an idealized op-amp, the output current may equal the input current times the gain set by the resistors coupled to the op-amp's input and output. That is:

$$I_{out}=I_{in} \times R1/R2 \quad [\text{Eq. 1}]$$

In the embodiment shown in FIG. 6, only the drain of MOSFET M3 sees the output voltage, and thus the output voltage capability may be increased by increasing the voltage capability of this single device. To effect such a high voltage output at values that exceed the breakdown voltage of individual devices of the output stack, bias circuitry may be provided to appropriately bias the output devices. In this way, a given process technology can be extended such that the working voltage of transistors configured in a complementary common-source configuration can exceed the breakdown voltage of individual transistors. Note that there is a trade-off between stacking of transistors and a size of the transistors. That is, as transistors are stacked, the transistors are made larger to afford smaller resistance.

Thus the output stack may be implemented using DMOS transistors configured in a complementary-source configuration. Specifically, the cascoded devices of the output stack divide the total operating voltage across multiple devices. The cascode voltage for each of the cascoded devices may be controlled by an offset voltage that tracks the output voltage by either a fixed or ratioed amount. In the case of a fixed offset, the transistor may be controlled by, for example, a Zener diode and a bias source. In the case of a ratioed amount, the cascode voltage may be provided by, for example, a resistor divider. In different embodiments, the selection of offset voltages and ratios may be optimized to maintain the individual devices well within their safe operating areas while sharing any additional margin appropriately between the devices. Furthermore, a handle wafer bias may be created by a Zener diode and a bias resistor so that over the operating power supply range, the potential on the handle wafer is optimized for safe operating conditions.

Still referring to FIG. 6, the bias circuitry to control transistors M1-M3 is further shown. Specifically, a first Zener diode Z1 is coupled between the negative power supply and a node N1 coupled to a gate terminal of MOSFET M2 and a first terminal of a resistor R3. The second terminal of resistor R3 is coupled to a gate terminal of MOSFET M3. As shown in FIG. 6, in one embodiment Zener diode Z1 may have a voltage of 21V such that the gate terminal of MOSFET M2 is biased at this value. In turn, the drain terminal of MOSFET M1 may be at approximately 20V. As further shown in FIG. 6, a diode D1 at a voltage of $V_{REG}+6$ and a compensation current source, e.g., of 10 microamps (µa), is coupled at node N1 to the gate terminal of MOSFET M2. A second Zener diode Z2 is further coupled to the gate terminal of MOSFET M3 and the output line. In this way, the output stack is controlled such that the total output voltage, which may reach approximately 140V, is split across the cascoded devices and the output device of op-amp 410. For example, MOSFET M1 may handle a voltage of approximately 25V, while MOSFET M2 may handle a voltage of approximately 50V, and MOSFET M3 handles a voltage of approximately 65V. Furthermore, via this biasing circuitry, when the individual devices turn on and how much extra margin each handles may be appropriately controlled. Thus in one implementation, a process technology such as an 80V DMOS technology may be used to provide an output voltage at or above 140V using a complementary common source output stack that operates at a voltage higher than the individual transistor breakdown voltages.

In the embodiment of FIG. 6, second Zener diode Z2 may limit the voltage across the top MOSFET M3 to approximately 70V. Note that when second Zener diode Z2 turns off, operation of the output stack is biased at a voltage of $V_{REG}+6V$. Accordingly, MOSFETS M2 and M3 operate in the triode region (i.e., operate as resistors that drop a relatively small voltage). In such operation, the output voltage can swing close to the negative supply voltage. Thus, while maintaining the ability for a high voltage output, circuit 400 can provide an output that is controlled to swing close to the negative supply voltage.

Still with reference to FIG. 6, during operation when the voltage begins to rise, the initial voltage may be taken by top MOSFET M3. Then, as the level continues to rise above the level of MOSFET M3, output MOSFET M1 may take voltage to its maximum (e.g., approximately 20V). Finally, second MOSFET M2 may take additional voltage as the voltage increases beyond the breakdown voltages of first and third MOSFETs M1 and M3. Accordingly, by appropriately choosing biasing circuitry for the output stack, a predetermined manner of operating circuit 400 such that given output devices of the output stack take voltage at different times in an operating cycle can be implemented. Furthermore, while described with an output stack including a first output MOSFET and a pair of cascoded DMOS devices, in different implementations, different numbers of transistors may be used.

In this way, a high voltage unidirectional current gain block may be implemented with very high accuracy, low distortion and low idling power dissipation. Furthermore, very few high voltage transistors are used. By combining two such unidirectional current gain circuits each closely coupled to a single voltage supply (e.g., negative or positive), an improved bidirectional current gain circuit may be effected. The output stack can swing close to the supply to which it is coupled, limited by the on resistance of the devices in the stack. Typically, these device sizes may be set by the current that they are to handle and how close to the supply voltage the devices are needed to go. In light load conditions, the devices may swing very close to the supply voltage. For example, in on-hook conditions, the voltage can go virtually to the power supply voltage. Thus these single-ended current gain amplifiers that are referenced only to a single power supply can be designed in a more optimum manner. Note that while the above discussion of FIG. 6 is with reference to an op-amp referenced to the negative power supply voltage and having n-channel output devices, it is to be understood that a similar unidirectional current amplifier of a complementary nature may also be present. That is, another unidirectional amplifier may be referenced to the positive power supply and may include p-channel devices at its output stack.

Figure 7:
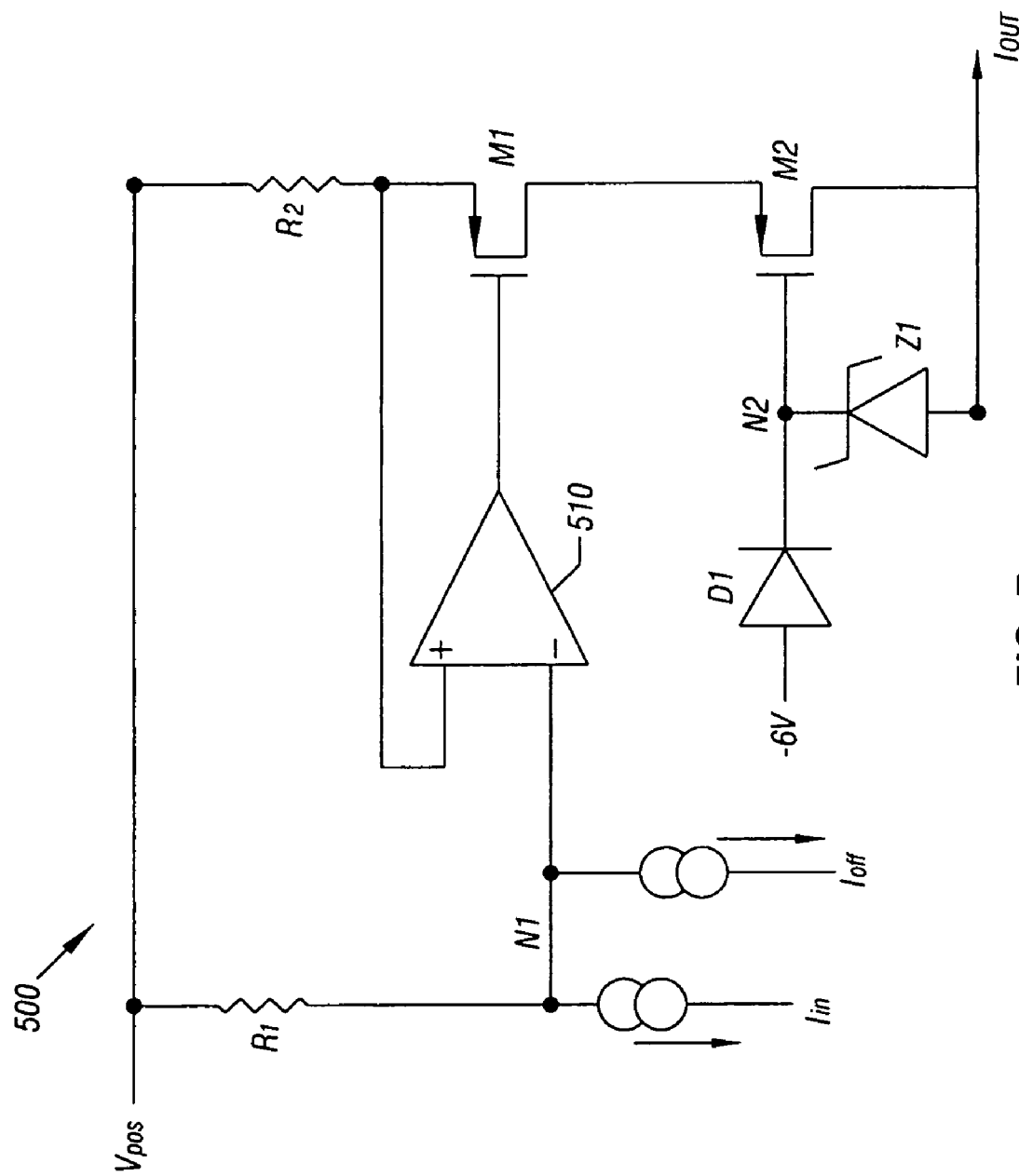
FIG. 7 is a schematic diagram of a unidirectional current gain amplifier circuit in accordance with another embodiment of the present invention.

Referring now to FIG. 7, shown is a schematic diagram of a unidirectional current gain amplifier circuit in accordance with another embodiment of the present invention. The amplifier circuit of FIG. 7 may be a p-channel current amplifier closely coupled to a positive supply voltage. As shown in FIG. 7, circuit 500 includes a low voltage amplifier 510, which may be a bipolar input op-amp. An input current into the positive terminal of op-amp 510 may be formed of an incoming current (i.e., $I_{in}$), plus an offset current (i.e., $I_{off}$) as discussed above. These currents are coupled to a node N1, also to which a first terminal of an input resistor R1 is coupled. The other terminal of resistor R1 is coupled to the supply voltage $V_{pos}$. The output of op-amp 510 is coupled to a first MOSFET M1 and more particularly to a gate terminal of first MOSFET M1, which may be a p-channel MOSFET. A source terminal of MOSFET M1 is further provided as a feedback to the negative input terminal of op-amp 510.

As shown in FIG. 7, the source terminal of MOSFET M1 is coupled to a resistor R2 that in turn is tied to the supply voltage, $V_{pos}$. An output stack in the embodiment of FIG. 7 is formed via this first MOSFET M1 and a second MOSFET M2 cascoded to first MOSFET M1. Accordingly, a source terminal of MOSFET M2 is coupled to a drain terminal of MOSFET M1. A drain terminal of MOSFET M2 in turn is coupled to an output line to provide a gained current in accordance with the ratio between R1 and R2. As further shown in FIG. 7, a first Zener diode Z1 is coupled between a gate terminal of MOSFET M2 at a node N2, to which a first diode D1 is also coupled, and the drain terminal of MOSFET M2 at an output node. As shown in FIG. 7, in one embodiment Zener diode Z1 may have a threshold voltage of 55V, and diode D1 may be at a voltage of −6V.

In this configuration, during normal operation (i.e., non-ringing), the output node of MOSFET M2 is never more than 55V, and accordingly, Zener diode Z1 is not turned on. In such mode of operation, the source terminal of MOSFET M1 is grounded and the source follower output provides a voltage to approximately 57V. At this level, MOSFET M1 is pulled out of saturation and current is pulled through Zener diode Z1 and additional voltage is then placed across MOSFET M1. Note that in comparison to the embodiment of FIG. 6, the output voltage cannot swing as close to ground. While described with this particular implementation and operation in the embodiment of FIG. 7, it is to be understood that an output stack may be differently configured in other embodiments.

Because in various embodiments, the current amplifiers may be formed of individual unidirectional current gain amplifiers, an input stage for the resulting bidirectional amplifier may include circuitry to enable a current fed into the input stage to be split between the unidirectional current amplifiers. In some implementations, the input stage may include an input level shifter that is biased at a fixed voltage between the positive and negative supply voltages. Accordingly, the input stage splits the input current, which interfaces to the circuit at a fixed voltage, into two unidirectional currents, each flowing either towards the positive supply or the negative supply. The input stage may split this current with high accuracy (i.e., no current gain or loss) and very little (if any) distortion. In this way, improved performance may be achieved across a range of operating frequencies.

Figure 8A:
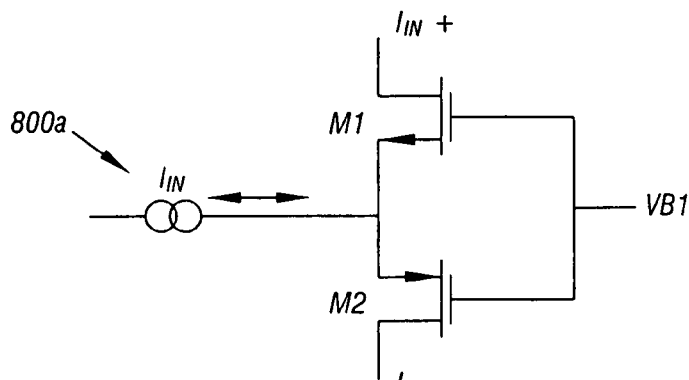
FIG. 8A is a schematic diagram of an input stage/level shifter/current splitter circuit in accordance with one embodiment of the present invention.

Referring now to FIG. 8A, shown is an input stage/level shifter/current splitter circuit in accordance with one embodiment of the present invention. As shown in FIG. 8A current splitter 800a may be formed of a first MOSFET M1 and a second MOSFET M2. Note that first MOSFET M1 may be an n-channel FET while second MOSFET M2 may be a p-channel FET. The sources of MOSFETs M1 and M2 are coupled to an input current $I_{in}$. In turn, the gates of MOSFETs M1 and M2 are coupled to a bias voltage, $V_{B1}$, and the drains of the MOSFETs provide the respective currents of positive and negative values (i.e., $I_{in+}$ and $I_{in-}$). In circuit 800a of FIG. 8A, MOSFETs M1 and M2 may be biased so that nominally only a single device is on at a given time. Note that in the embodiment of FIG. 8A, the input voltage must change from $V_{B1}-V_{TN}$ to $V_{B1}+V_{TP}$ (where $V_{TN}$ is the n-channel threshold voltage and $V_{TP}$ is the p-channel threshold voltage) to switch the current from MOSFET M1 to MOSFET M2. Accordingly, the input current flows in one of the two devices from source to drain and high accuracy is maintained as the source and drain currents of MOSFETs M1 and M2 are equal.

Distortion effects may occur as one device turns off and the other device turns on. The bias voltage may be set up so that one device must turn off before the other device turns on, which can create a small region of distortion commonly referred to as crossover distortion. However, such distortion can be minimized by careful design. For example, the devices may be biased such that at zero input current, both devices are slightly on. In this way, a small "idling" current is created in the stage. However, since this current flows equally in both directions, it is canceled at the output of the input stage. Because this input idling current creates an output idling current that is N times greater than the input idling current it should be kept low to reduce power dissipation.

Figure 8B:
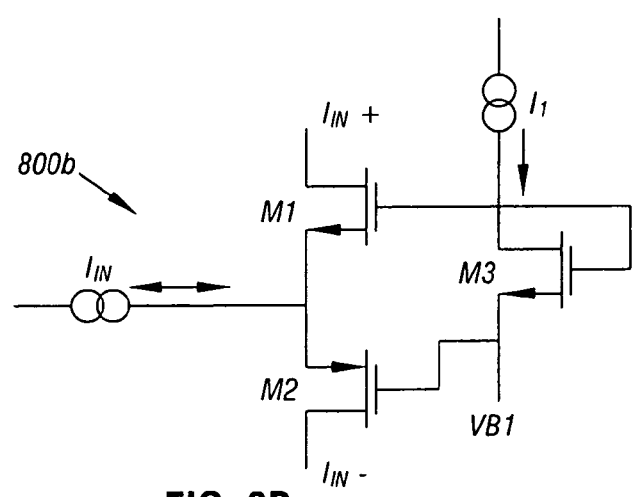
FIG. 8B is a schematic diagram of an input stage/level shifter/current splitter circuit that includes an idling current in accordance with another embodiment of the present invention.

Referring now to FIG. 8B, shown is an input stage/level shifter/current splitter circuit that includes an idling current so that switching between devices may swing with only a single threshold voltage. In the embodiment of FIG. 8B, this idling current may be very low, and close to zero. As shown in FIG. 8B, current splitter 800b includes in addition to MOSFETs M1 and M2, an idling current $I_1$. This idling current may be coupled to a third MOSFET M3, which may be an n-channel device that has a gate and drain terminals tied to a gate of MOSFET M1 and the idling current $I_1$, and a source terminal coupled to a gate of MOSFET M2 and the bias voltage $V_{B1}$. Accordingly, the input voltage must swing from $V_{B1}+V_{TP}$ to $V_{B1}$ to switch current from the n-channel device M1 to the p-channel device M2.

Figure 8C:
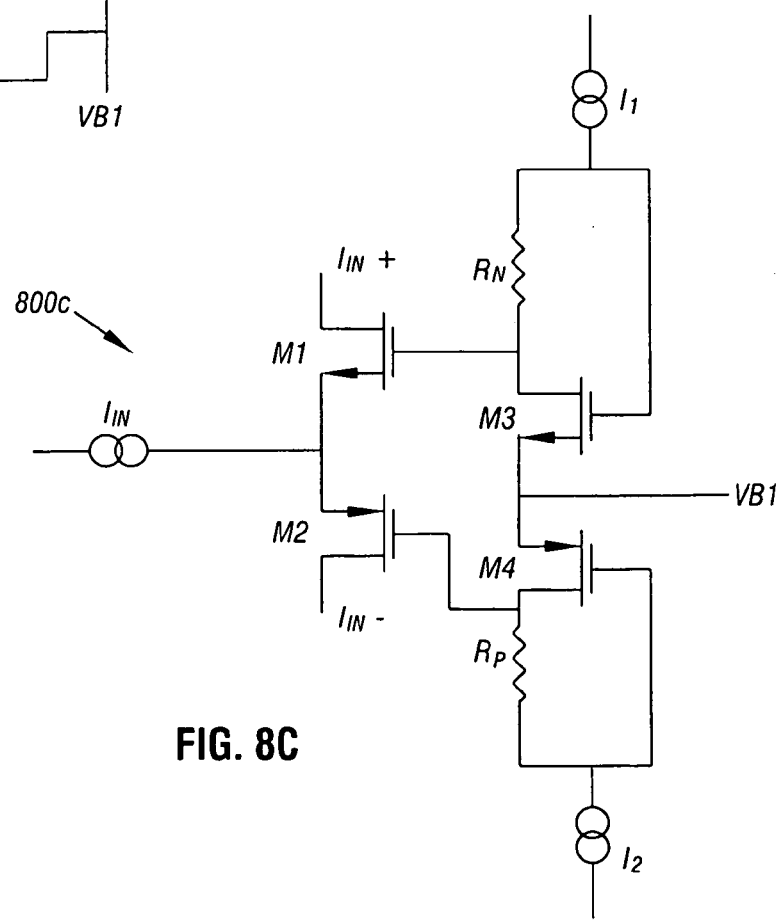
FIG. 8C is a schematic diagram of an input stage/level shifter/current splitter circuit in accordance with yet another embodiment of the present invention.

To enable switching of current directions with very little input swing, another control MOSFET may be coupled to an additional current source. Accordingly, as shown in FIG. 8C, input stage/level shifter/current splitter circuit 800c additionally includes a fourth MOSFET M4, along with bias resistors $R_N$ and $R_P$. Accordingly, switching the current from the n-channel device M1 to the p-channel device M2 occurs when the input voltage changes from $V_{B1}-I_1R_N$ to $V_{B1}+I_2R_P$. By appropriate selection of device sizes and bias resistor values, very little input swing is needed to switch current directions. Note that the idling current may be adjusted by controlling the bias resistor values, in some embodiments. Further, while shown with these different embodiments in FIGS. 8A-8C, it is to be understood that the scope of the present invention is not so limited and input stages/level shifters/current splitter circuits may be implemented in other fashions in different embodiments.

Figure 9:
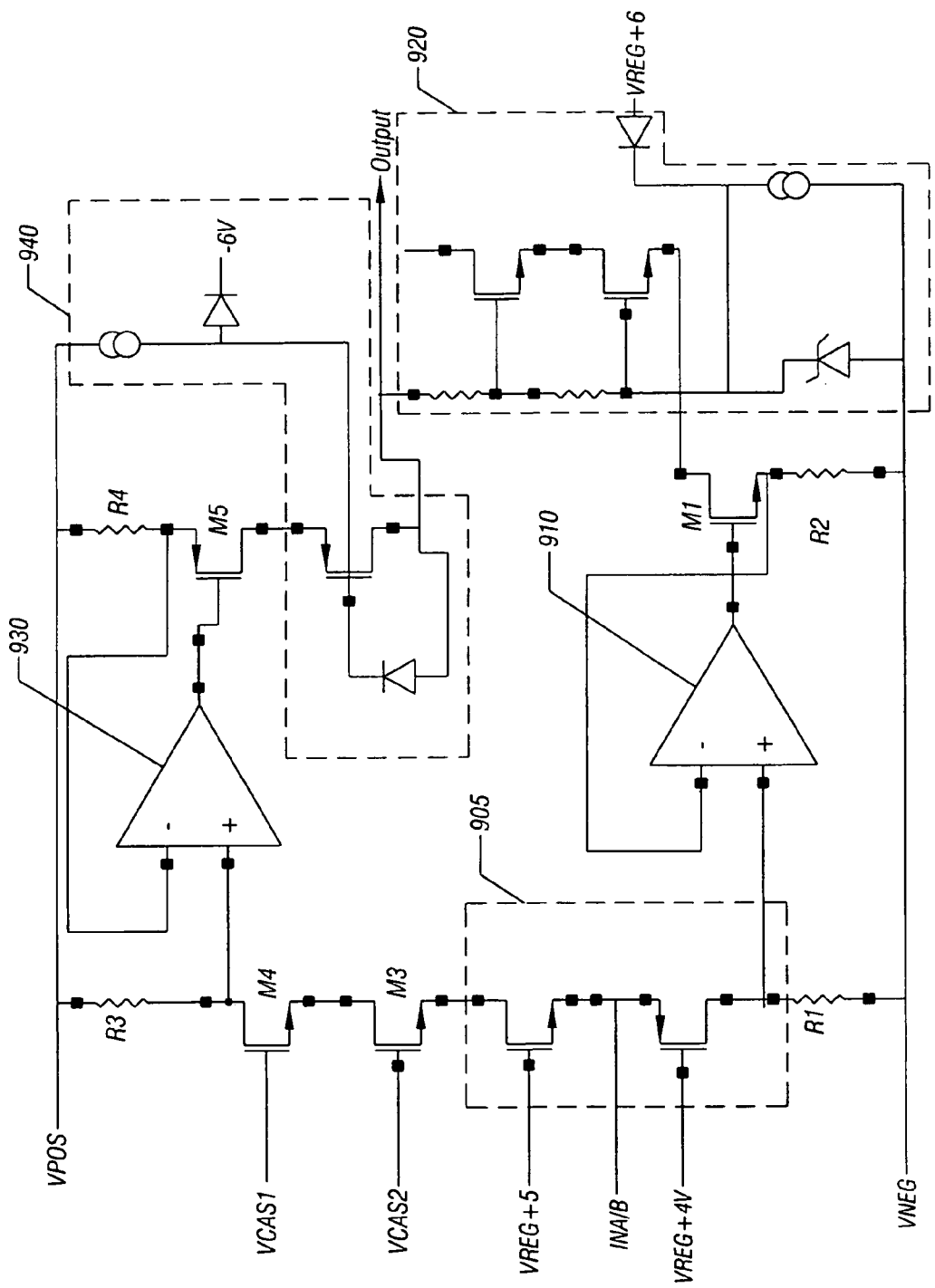
FIG. 9 is a schematic diagram of a bidirectional current amplifier in accordance with an embodiment of the present invention.

Referring now to FIG. 9, shown is a schematic diagram of a bidirectional current amplifier formed of two unidirectional current amplifiers, such as those shown in FIGS. 6 and 7, along with an input stage such as one of those shown in FIGS. 8A-8C and an output stack in accordance with an embodiment of the present invention.

As shown in FIG. 9, an op-amp 910 is coupled to receive an input current from a p-channel device of an input stage 905. Op-amp 910 provides an amplified output to an output stack 920 via an output MOSFET M1. The gain of op-amp 910 may be set by the values of R1 and R2 coupled to the input and output, respectively of op-amp 910.

Similarly, an op-amp 930 is coupled to receive an input current from an n-channel device of input stage 905, to which is further coupled to a pair of cascoded MOSFETs M3 and M4. The gain of op-amp 930 is set by respective values of resistors R3 and R4, coupled to the input and output of op-amp 930, respectively. In turn, the output of op-amp 930 is coupled via an output MOSFET M5 to an output stack 940.

As shown in FIG. 9, input splitting circuit 905 is coupled to cascode transistors M3 and M4 on the positive side to reduce the voltage requirements on any single device and to allow operation at a voltage that is higher than the breakdown voltage of any individual transistor. If the individual transistors have breakdown voltages higher than the supply voltages, the cascodes can be removed. The only devices that ever see the full supply voltage are output transistors of the output stacks, which may be cascoded. The current gain of the two unidirectional current amplifiers may be matched as closely as possible, which can be achieved with good layout and design with matching of about 0.1%. Mismatches in these gains can create harmonic distortion. DC offset currents will flow between the two unidirectional directions outputs with the final output offset current being the difference between the individual offset currents. A small idling current in each unidirectional directional current gain block may keep the low voltage amplifiers properly biased under all conditions and avoid overload recovery response time issues. This idling current (not shown in FIG. 9) can be designed as part of the input current splitting bias design or added with separate idle current bias current sources. Circuit 900 may thus achieve the goals of precision current gain, high output voltage compliance, low power dissipation and low cost. It minimizes the number of truly high voltage transistors to implement the design, which greatly reduces the cost.

In various embodiments current mirrors may be used in various locations of systems implementing SLIC functionality in accordance with an embodiment of the present invention. In other embodiments, such current mirrors may be used in other types of circuitry. As described further below, current mirrors can be used in circuits where reduced input voltages are present. Furthermore, such current mirrors may enable greater compliance of an output impedance. Furthermore, while operating at low current levels, current mirrors in accordance with an embodiment of the present invention may still provide needed accuracy at these low current levels. Accordingly, current mirrors in accordance with an embodiment of the present invention may include both MOSFET devices and bipolar devices in combination with, e.g., emitter resistors and optionally output cascode devices to enable desired gain while reducing input voltage requirements.

Figure 10A:
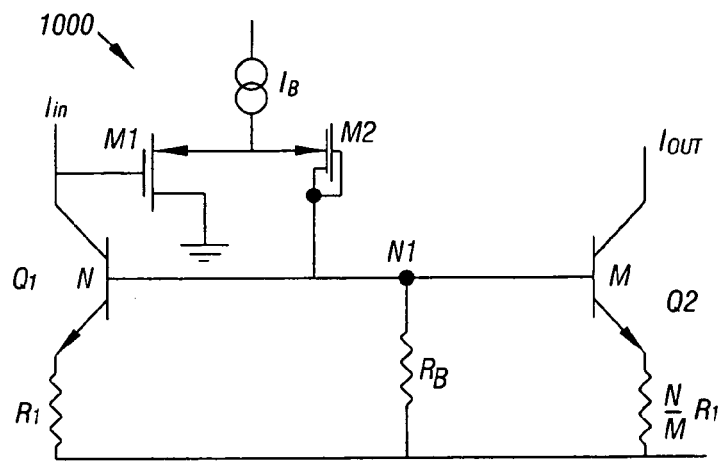
FIG. 10A is a schematic diagram of a current mirror in accordance with one embodiment of the present invention.

Referring now to FIG. 10A, shown is a schematic diagram of a current mirror in accordance with one embodiment of the present invention. As shown in FIG. 10A, current mirror 1000 includes an input bipolar device Q1 and an output bipolar device Q2 having base terminals coupled together. The current gain of current mirror 1000 is set by the relative device sizes (i.e., n and m) and the value of a first resistor R1 coupled to the emitter of bipolar device Q1 and a second resistor N/M R1, coupled to the emitter of bipolar device Q2. These emitter resistors may improve mirror accuracy as resistors may be matched more readily than transistors. Furthermore, if the voltage drop across the resistors is set high enough, mirror accuracy may be dominated by the resistor matching. In various implementations, the resistor values may be set several times larger than 1/gm of the corresponding bipolar devices. Because bipolar devices have higher transconductances than MOSFETs, use of bipolar input and output devices may enable much lower resistor values and corresponding lower voltage losses in the resistors. In various embodiments, the DC voltage drop across the emitter resistors may be significantly higher than approximately 26 millivolts (mV) to ensure that resistors dominate the matching. For example, a 100 mV drop reduces the effect of transistor mismatch by a factor of about 5, while a 225 mV drop reduces the mismatch by a factor of approximately 10.

To avoid the effects of effective input current reduction caused by a beta dependent current loss, a pair of MOSFETs may further be present. Specifically, as shown in FIG. 10A, a pair of MOSFETs M1 and M2 are coupled to a bias current source $I_B$, which may be a resistor, for example, and which is more particularly coupled to source terminals of these p-channel MOSFETs. MOSFET M1 further has a gate terminal coupled to the input current and a drain terminal coupled to ground. MOSFET M2 is diode-connected to a common node N1 at the base terminals of bipolar devices Q1 and Q2, to which a third resistor, RB is further coupled. Resistor RB, further coupled to ground, may be set to maintain the current in MOSFETs M1 and M2 to a certain minimum current.

The base currents for Q1 and Q2 and the bias current for RB are provided by current source IB, which flows through MOSFET M2. MOSFET M1 is the control device, which acts to sink the excess current. The current source IB may be set so that under most conditions, M1 and M2 run at similar currents and the collector-emitter voltage of Q1 is zero volts. The differential voltage between M1 and M2 may be controlled so that it does not get too large, as this would increase the input voltage range or reduce the voltage across Q1 to the point where it saturates. This can be done by making the current in RB greater than the base currents of Q1 and Q2 and setting IB to slightly more than 2 times the current in RB. In some implementations, IB may be greater than $I_{BQ1}+I_{BQ2}+I_{RB}$. The input voltage range thus corresponds to Vbe plus the IR drop across R1, or typically less than 1V.

Figure 10B:
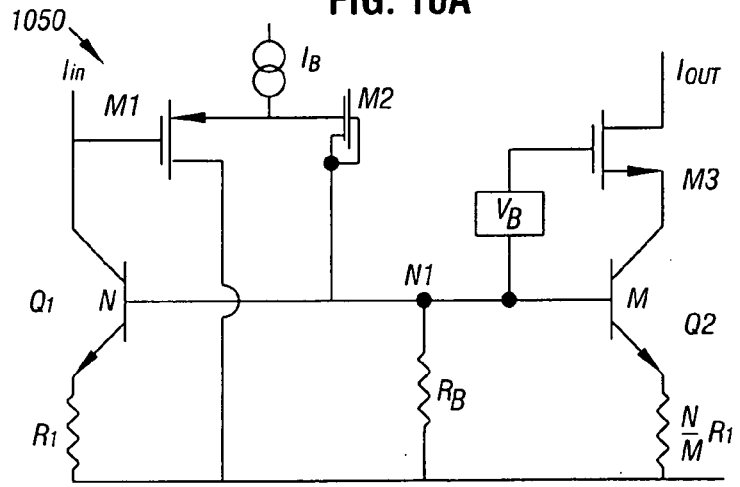
FIG. 10B is a schematic diagram of another current mirror in accordance with an embodiment of the present invention.

Further reductions in either the input voltage range or the output voltage range may be effected by including a cascode device. Thus as shown in FIG. 10B, circuit 1050 shows a biasing scheme to add a cascode to the output without reducing either the input or output voltage range. Thus circuit 1050 of FIG. 10B includes an n-channel MOSFET M3 cascoded to the collector of bipolar device Q2. The gate of MOSFET M3 is coupled to a bias voltage, VB, also coupled to the common node N1 of the base terminals of bipolar devices Q1 and Q2. Accordingly, the cascoded output increases output impedance. Furthermore, by using bipolar devices, improved matching and low noise is realized however, current loss can be a concern. Accordingly, using MOSFETs M1 and M2 as bias transistors, reduced current loss is realized.

Figure 10C:
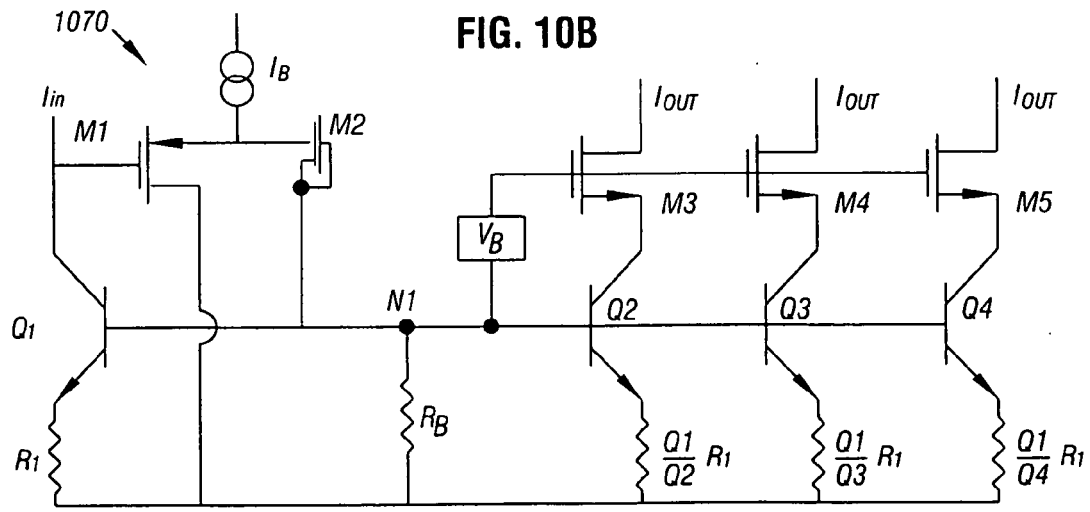
FIG. 10C is a schematic diagram of yet another current mirror in accordance with an embodiment of the present invention.

In other implementations, multiple output devices can be driven using the current mirror such that a circuit may include multiple bipolar output devices and corresponding cascoded MOSFETs coupled thereto. In the example shown in FIG. 10C, circuit 1070 includes three such output bipolar devices and corresponding MOSFETs. Of course, other implementations are possible. Accordingly, using current mirrors in accordance with an embodiment of the present invention reduced voltage overhead needed by the current mirrors is effected, allowing high gain current amplifiers with reduced supply voltage requirements. Furthermore, the combination of bipolar and MOSFET devices optimizes accuracy, output impedance and output voltage range while reducing the voltage range required. While not shown in FIGS. 10A-10C for ease of illustration, it is to be understood that an output stack such as those shown in FIGS. 6, 7 and 9 may be coupled to the output devices of FIGS. 10A-10C.

Figure 11:
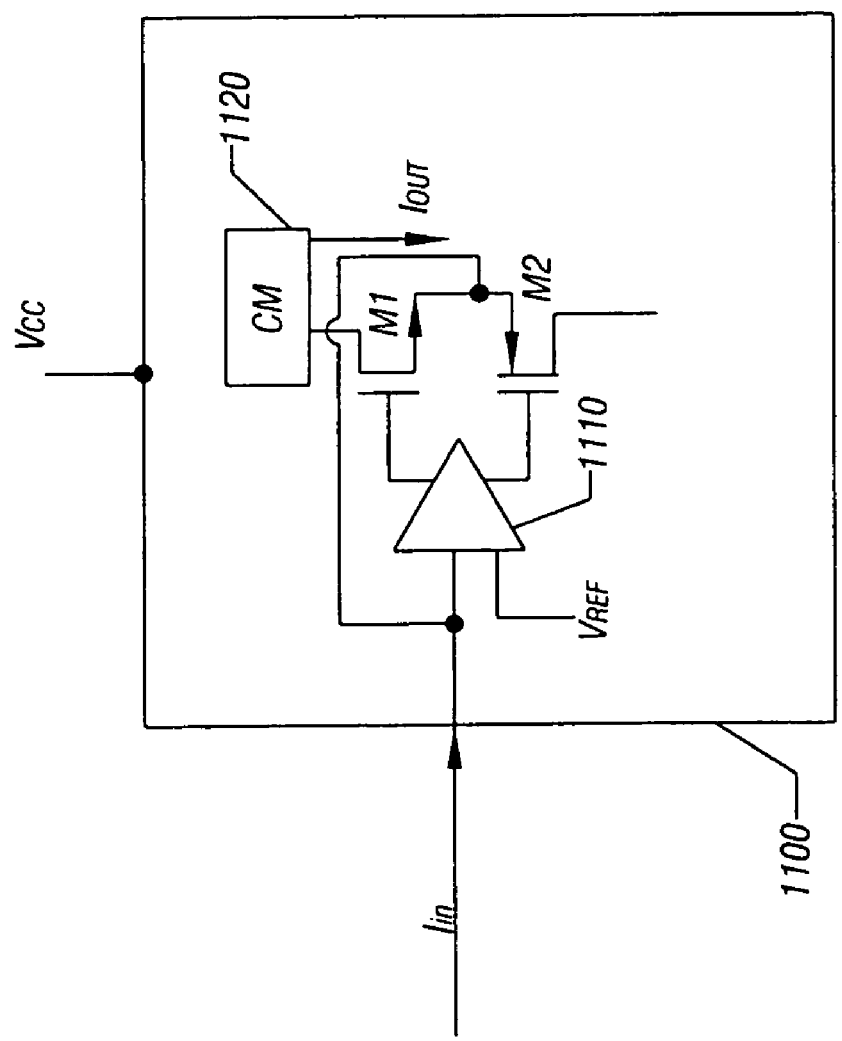
FIG. 11 is a block diagram of an input stage that acts as a current splitter/rectifier in accordance with one embodiment of the present invention.

Current mirrors in accordance with an embodiment of the present invention can be used in many different locations for different purposes. For example, because of the low input/output voltage drop and high accuracy possible by such a current mirror, it may be used in an input stage to provide current gain with low voltage drop. Referring now to FIG. 11, shown is a block diagram of an implementation of a current mirror in accordance with an embodiment of the present invention. As shown in FIG. 11 an input stage 1100, which may be a metallic input stage for a SLIC in accordance with an embodiment of the present invention, is coupled to receive an incoming current, $I_{in}$. The current may be of relatively low levels. For example, in some implementations the incoming current may be between approximately 100 microamps (μa) to two milliamps (mA) (although the scope of the present invention is not limited in this regard).

As shown in FIG. 11, the input current may be provided to one input of an op-amp 1110, which may be a low-voltage op-amp in accordance with an embodiment of the present invention. As shown, the other input of op-amp 1110 may be coupled to receive a reference voltage ($V_{REF}$), e.g., 1.4 volts, in some embodiments. In turn, the output of op-amp 1110 may be coupled to a pair of MOSFETs, namely a nMOSFET M1 and a pMOSFET M2 having source terminals coupled together and gate terminals coupled to receive the output of op-amp 1110. In turn, the commonly-coupled source terminals may be fed back to the input line of op-amp 1110. Note that the drain terminal of MOSFET M1 is coupled to a current mirror 1120, which is a current mirror in accordance with an embodiment of the present invention.

Because current mirror 1120 may provide for accuracy with a low voltage drop and thus provide for good input/output range, current mirror 1120 may be coupled to a supply voltage, while maintaining assurance that the voltage drop across current mirror 1120 is low enough such that sufficient voltage margin is present for op-amp 1110 coupled thereto. For example, in one implementation current mirror 1120 may be coupled to a supply voltage of 3.3 V. Note that the actual value of such a supply voltage may vary, and accordingly may only be at a level of, for example, 3.15 V. Because of the reduced voltage drop across current mirror 1120, sufficient margin is still present. Current mirror 1120 thus provides an output current, $I_{OUT}$ which may be at a value in accordance with a resistor ratio of the current mirror. This is so, as with a bipolar current mirror, a higher gm exists such than the resistors of the current mirror dominate matching.

Figure 12:
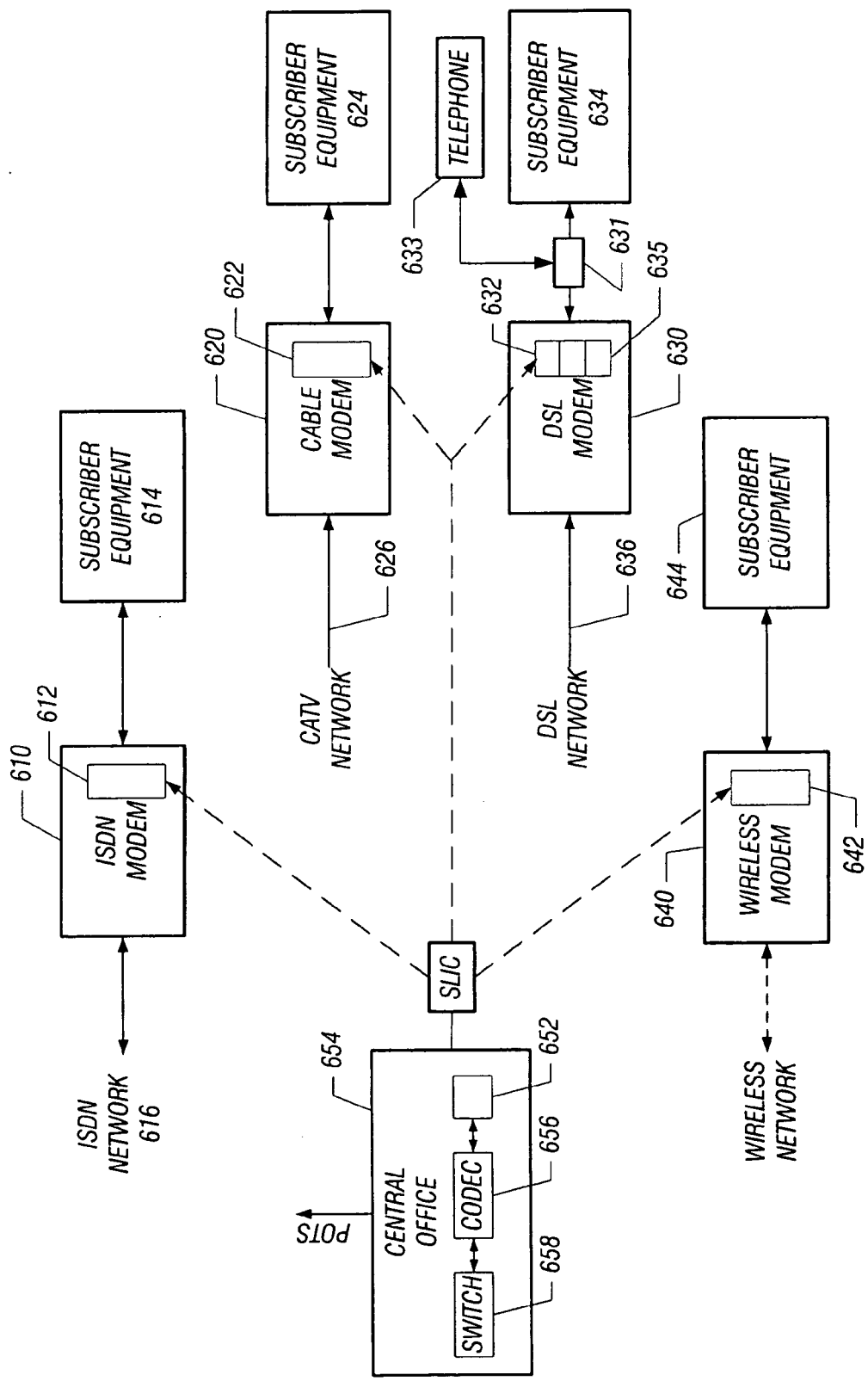
FIG. 12 is a block diagram illustrating various short and long loop applications for a SLIC.

In some applications a SLIC in accordance with an embodiment of the present invention may be used in a central telephone exchange that communicates with subscriber equipment using the POTS ("plain old telephone system") interface. Such an implementation is shown in FIG. 12, which shows illustrations of various long and short loop applications for a SLIC. As shown in FIG. 12, one application of a SLIC is in connection with a central office. Specifically, as shown in FIG. 12, central office 654 includes a SLIC 652 which is coupled to a POTS interface. In turn, SLIC 652 is coupled to a CODEC 656 and a switch 658. Of course, other implementations are possible. Other SLIC applications include private exchanges and short loop applications. Short loop applications often have a relatively short distance subscriber loop between the subscriber equipment and the SLIC. This is often the case when subscriber equipment interfaces with a non-POTS system such as a network that uses different communication media or protocols.

As shown in FIG. 12, in one embodiment, a SLIC 612 is used in an Integrated Services Digital Network (ISDN) modem 610. ISDN modem 610 provides bidirectional communication between subscriber equipment 614 and the ISDN network 616. In another embodiment, SLIC 622 is used in cable modem 620. In one embodiment, cable modem 620 communicates information using the community antenna television (CATV) network 616. SLIC 622 may enable cable modem 620 to communicate information from the coaxial CATV cable 626 to subscriber equipment 624. In another example, digital subscriber line (DSL) modem 630 incorporates a SLIC 632 and a DSL interface 635 for communication with digital subscriber line 636. In turn, DSL modem 630 is coupled to a splitter 631, which in turn is coupled to subscriber equipment 634, e.g., a computer system for communication of digital data at high speeds. Furthermore, splitter 631 couples to a telephone 633 for communication of voice data. Another example includes wireless applications such as wireless modem 640 including a SLIC 642 that in turn is coupled between a wireless network and subscriber equipment 644. Of course, other applications are possible. Unlike the central exchange applications, the short loop applications may enable the design of SLICs having relaxed performance characteristics: In particular, a short loop application SLIC need not necessarily meet typical POTS standards if the subscriber equipment is not actually connected to the public telephone network.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an operational amplifier having a first input coupled to receive a first current formed of an input current and an offset current;
   a first metal-oxide-semiconductor field effect transistor (MOSFET) device having a gate terminal coupled to an output of the operational amplifier, the first MOSFET device having a second terminal coupled to a second input of the operational amplifier;
   an output stack coupled to a first terminal of the first MOSFET device, the output stack comprising at least one cascoded device, wherein a first terminal of a first cascoded device is to provide an output current corresponding to a gain of the operational amplifier;
   a first resistor coupled between the first input of the operational amplifier and a first supply voltage;
   a second resistor coupled between the second terminal of the first MOSFET device and the first supply voltage, wherein a ratio of the first resistor to the second resistor sets the gain;
   a first Zener diode coupled between the first supply voltage and a gate terminal of a second cascoded device; and
   a second Zener diode coupled between the first terminal of the first cascoded device and a third resistor coupled to the gate terminal of the second cascoded device.

2. The apparatus of claim 1, wherein the operational amplifier includes bipolar input devices.

3. The apparatus of claim 1, further comprising a second operational amplifier to generate a second output current corresponding to a gain of the second operational amplifier, the second output current having an opposite polarity than the output current of the operational amplifier, wherein the second operational amplifier includes:
   a first input coupled to receive a second current formed of an input current and an offset current;
   a second MOSFET device having a gate terminal coupled to an output of the second operational amplifier, the second MOSFET device having a second terminal coupled to a second input of the second operational amplifier; and
   an output stack coupled to a first terminal of the second MOSFET device, the output stack comprising at least one cascoded device, wherein a second terminal of the at least one cascoded device is to provide the second output current.

4. The apparatus of claim 3, wherein the operational amplifier and the second operational amplifier comprise unidirectional current amplifiers.

5. The apparatus of claim 4, further comprising an input level shifter to receive and split a bidirectional input current into a first unidirectional current coupled to the operational amplifier and a second unidirectional current coupled to the second operational amplifier.

6. The apparatus of claim 5, wherein the input level shifter comprises:
a pair of complementary MOSFET devices each having a second terminal coupled to receive the bidirectional input current; and
a third MOSFET device having a gate terminal coupled to a gate terminal of a first one of the pair of complementary MOSFET devices, a second terminal coupled to a gate terminal of a second one of the pair of complementary MOSFET devices, wherein a first terminal of the third MOSFET device is coupled to an idling current.

7. The apparatus of claim 5, wherein the input level shifter comprises:
a pair of complementary MOSFET devices each having a second terminal coupled to receive the bidirectional input current and a first terminal to provide a respective one of the first and second unidirectional currents; and
a first idle current source coupled to a first resistor and a gate terminal of a first bias transistor, the first bias transistor having a second terminal coupled to a bias voltage node; and
a second idle current source coupled to a second resistor and a gate terminal of a second bias transistor, the second bias transistor having a second terminal coupled to the bias voltage node, wherein a first terminal of the first bias transistor and the second bias transistor are coupled to a respective gate terminal of one of the pair of complementary MOSFET devices.

8. An apparatus comprising:
an operational amplifier having a first input coupled to receive an input current and comprising a unidirectional current amplifier closely coupled to a single power supply of a first polarity;
a first current source to generate an offset current to be provided to the first input, wherein the offset current is to prevent saturation of the operational amplifier when the input current is substantially zero;
a first metal-oxide-semiconductor field effect transistor (MOSFET) device having a gate terminal coupled to an output of the operational amplifier;
an output stack coupled to a first terminal of the first MOSFET device, the output stack comprising at least one cascaded device, wherein a first terminal of a first cascaded device is to provide an output current corresponding to a gain of the operational amplifier;
a first resistor coupled between the first input of the operational amplifier and a first supply voltage;
a second resistor coupled between the second terminal of the first MOSFET device and the first supply voltage, wherein a ratio of the first resistor to the second resistor sets the gain;
a second unidirectional current operational amplifier closely coupled to a single power supply of a second polarity; and
an input level shifter to receive and split a bidirectional input current into a first unidirectional current coupled to the unidirectional current amplifier and a second unidirectional current coupled to the second unidirectional current amplifier.

9. The apparatus of claim 8, wherein the operational amplifier comprises a low voltage amplifier including bipolar input devices.

10. The apparatus of claim 8, wherein the output stack further comprises a control structure to control the at least one cascoded device to provide an output voltage that exceeds a breakdown voltage of the at least one cascoded device, wherein the at least one cascoded device comprises a double-diffusion metal-oxide semiconductor (DMOS) device.

11. An apparatus comprising:
an unidirectional current amplifier having a first input coupled to receive an input current of a first polarity only;
an output device having a gate terminal coupled to an output of the unidirectional current amplifier, the output device having a second terminal coupled to a second input of the operational amplifier;
an output stack coupled to a first terminal of the output device, the output stack comprising at least two cascoded devices, wherein a first terminal of a top one of the cascoded devices is to provide an output current corresponding to a gain of the unidirectional current amplifier;
an input resistor coupled between the first input of the unidirectional current amplifier and a supply potential of the first polarity;
an output resistor coupled between the second terminal of the output device and the supply potential of the first polarity; and
an input level shifter to receive and split a bidirectional input current into the input current of the first polarity coupled to the unidirectional current amplifier and an input current of a second polarity coupled to a second unidirectional current amplifier.

12. The apparatus of claim 11, wherein the unidirectional current amplifier includes bipolar input devices, wherein the unidirectional current amplifier comprises a low voltage operational amplifier.

13. The apparatus of claim 11, further comprising a bias circuit to control the output stack, wherein the bias circuit is to control a first one of the cascoded devices to take an output voltage until the output voltage reaches a first threshold, and then to control the output device to take the output voltage in combination with the first cascoded device until the output voltage reaches a second threshold, and then to control a second one of the cascoded devices to take the output voltage in combination with the first cascoded device and the output device.

* * * * *

UNITED STATES PATENT AND TRADEMARK OFFICE
CERTIFICATE OF CORRECTION

PATENT NO. : 7,970,125 B2  
APPLICATION NO. : 11/453418  
DATED : June 28, 2011  
INVENTOR(S) : Russell J. Apfel et al.

Page 1 of 1

It is certified that error appears in the above-identified patent and that said Letters Patent is hereby corrected as shown below:

IN THE CLAIMS:

Column 17:  
Line 50, Claim 8, "cascaded" should be -- cascoded --.

Column 17:  
Line 51, Claim 8, "cascaded" should be -- cascoded --.

Signed and Sealed this  
Sixth Day of September, 2011

David J. Kappos  
*Director of the United States Patent and Trademark Office*